(12) United States Patent
Fujino et al.

(10) Patent No.: US 10,566,392 B2
(45) Date of Patent: Feb. 18, 2020

(54) ENCAPSULATION METHOD, DISPLAY PANEL AND DISPLAY DEVICE

(71) Applicant: Boe Technology Group Co., Ltd., Beijing (CN)

(72) Inventors: Seiji Fujino, Beijing (CN); Song Zhang, Beijing (CN); Jing Gao, Beijing (CN); Tao Wang, Beijing (CN); Xiaobo Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 168 days.

(21) Appl. No.: 15/108,019

(22) PCT Filed: Jan. 19, 2016

(86) PCT No.: PCT/CN2016/071334
§ 371 (c)(1),
(2) Date: Jun. 24, 2016

(87) PCT Pub. No.: WO2017/008486
PCT Pub. Date: Jan. 19, 2017

(65) Prior Publication Data
US 2017/0194380 A1 Jul. 6, 2017

(30) Foreign Application Priority Data
Jul. 10, 2015 (CN) .......................... 2015 1 0406012

(51) Int. Cl.
*H01L 29/08* (2006.01)
*H01L 27/32* (2006.01)
(Continued)

(52) U.S. Cl.
CPC .......... *H01L 27/322* (2013.01); *H01L 51/529* (2013.01); *H01L 51/5246* (2013.01); *H01L 51/5253* (2013.01); *H01L 51/56* (2013.01)

(58) Field of Classification Search
CPC ...................................................... H01L 27/322
(Continued)

(56) References Cited

U.S. PATENT DOCUMENTS

2007/0145892 A1* 6/2007 Chen .................. H01L 51/5271
313/506
2009/0174638 A1* 7/2009 Brown Elliott ... G02F 1/133621
345/88
(Continued)

FOREIGN PATENT DOCUMENTS

CN 102024422 4/2011
CN 104167426 11/2014
(Continued)

OTHER PUBLICATIONS

Full English machine transaltion (text only) of IDS reference Zaifeng (CN 104167426A), published Nov. 26, 2014.*
(Continued)

*Primary Examiner* — Ajay Arora
(74) *Attorney, Agent, or Firm* — Calfee, Halter & Griswold LLP

(57) ABSTRACT

The embodiments of the present invention provide an encapsulation method, a display panel and a display device. The encapsulation method includes: forming a first room temperature bonding layer on the encapsulation region of the array substrate, an OLED device is formed on the display region of the array substrate; forming a second room temperature bonding layer on the encapsulation region of the heat diffuser plate; vacuum laminating the array substrate and the heat diffuser plate such that the first room temperature bonding layer and the second room temperature bonding layer contact with each other and form a sealed structure. The encapsulation method omits the existing encapsulation substrate by using room temperature bonding technology to encapsulate the heat diffuser plate and the array substrate,
(Continued)

therefore can not only reduce the overall thickness of the display panel but also further improve the heat dissipation effect.

20 Claims, 2 Drawing Sheets

(51) Int. Cl.
*H01L 51/52* (2006.01)
*H01L 51/56* (2006.01)

(58) Field of Classification Search
USPC .......................................................... 257/40
See application file for complete search history.

(56) References Cited

U.S. PATENT DOCUMENTS

| | | | |
|---|---|---|---|
| 2010/0045173 A1* | 2/2010 | Kwon | H01L 27/3246 313/504 |
| 2011/0063263 A1* | 3/2011 | Lee | H01L 27/3244 345/204 |
| 2013/0237040 A1* | 9/2013 | Kakuta | B32B 7/06 438/479 |
| 2014/0119024 A1* | 5/2014 | Yu | F21S 6/00 362/294 |
| 2016/0293886 A1* | 10/2016 | Yu | H01L 51/56 |

FOREIGN PATENT DOCUMENTS

| | | |
|---|---|---|
| CN | 104617128 | 5/2015 |
| CN | 104966727 | 10/2015 |
| JP | 2008218306 | 9/2008 |

OTHER PUBLICATIONS

International Search Report and Written Opinion from PCT/CN16/071334 dated Apr. 20, 2016.

Second Office Action for Chinese Patent Application No. 201510406012.9 dated Jan. 2, 2018.

First Office Action for Chinese Patent Application No. 201510406012.9 dated Jun. 14, 2017.

Decision on Rejection for Chinese Patent Application No. 201510406012.9 dated Apr. 19, 2018.

* cited by examiner

ENCAPSULATION METHOD, DISPLAY PANEL AND DISPLAY DEVICE

RELATED APPLICATIONS

The present application is the U.S. national phase entry of PCT/CN2016/071334, with an international filing date of Jan. 19, 2016, which claims the benefit of Chinese Patent Application No. 201510406012.9, filed on Jul. 10, 2015, the entire disclosures of which are incorporated herein by reference.

TECHNICAL FIELD

The present invention relates to the display field, and particularly to an encapsulation method, a display panel and a display device.

BACKGROUND

An organic light-emitting diode (abbreviated to OLED) display panel has many advantages including active luminescence, high brightness, high contrast, ultra thin thickness, low power consumption, large viewing angle, wide range of operating temperatures and the like, and is an advanced, novel tablet display device that has been applied widely.

The current OLED display panel mainly comprises an encapsulation substrate (glass material) and an array substrate on which an OLED device is formed. A sealed structure is formed between the encapsulation substrate and the array substrate by means of encapsulation technologies, thereby protecting the OLED device on the array substrate against water oxygen erosion from the outside. During the operation of the OLED display panel, the OLED device therein would inevitably release a large amount of heat. To increase the heat dissipation ability of the OLED display panel, at present, a layer of heat diffuser plate usually covers a side of the OLED display panel, such as a side of the encapsulation substrate which is opposite to the array substrate. However, this plate will inevitably increase the overall thickness of the panel.

SUMMARY

The present disclosure provides an encapsulation method, comprising:

forming a first room temperature bonding layer on the encapsulation region of the array substrate, where in an OLED device is formed on the display region of the array substrate;

forming a second room temperature bonding layer on the encapsulation region of the heat diffuser plate;

vacuum laminating the array substrate and the heat diffuser plate, such that the first room temperature bonding layer and the second room temperature bonding layer contact with each other and form a sealed structure.

In certain embodiments, the material of the heat diffuser plate includes at least one of Cu, Al, ITO, IZO and AZO.

In certain embodiments, the heat diffuser plate has a thickness ranging from 50 μm to 100 μm.

In certain embodiments, the material of the first room temperature bonding layer is Si, Al, Cu, Fe or Au, and the material of the second room temperature bonding layer is Si, Al, Cu, Fe or Au.

In certain embodiments, the OLED device comprises a plurality of light-emitting units which emit white light, wherein a color filter layer is further formed on the array substrate, and the color filter layer comprises a plurality of color filter units via which white light emitted by the light-emitting units is converted into light of corresponding colors.

In certain embodiments, the plurality of light-emitting units are arranged in matrix formation, the plurality of color filter units are arranged in matrix formation, and the plurality of light-emitting units and the plurality of color filter units are arranged to be respectively and directly aligned.

In certain embodiments, the OLED device comprises a plurality of light-emitting units, and the plurality of light-emitting units comprise at least three kinds of light-emitting units which emit light of different colors.

In certain embodiments, the plurality of light-emitting units are arranged in matrix formation.

The present disclosure further provides a display panel comprising an array substrate and a heat diffuser plate oppositely arranged to each other. The display region of the array substrate is provided with an OLED device, the encapsulation region of the array substrate is provided with a first room temperature bonding layer, and the encapsulation region of the heat diffuser plate is provided with a second room temperature bonding layer. The first room temperature bonding layer and the second room temperature bonding layer are contacted with each other and are stacked so as to form a sealed structure between the array substrate and the heat diffuser plate.

In certain embodiments, the material of the heat diffuser plate includes at least one of Cu, Al, ITO, IZO and AZO.

In certain embodiments, the heat diffuser plate has a thickness ranging from 50 μm to 100 μm.

In certain embodiments, the material of the first room temperature bonding layer is Si, Al, Cu, Fe or Au, and the material of the second room temperature bonding layer is Si, Al, Cu, Fe or Au.

In certain embodiments, the OLED device comprises a plurality of light-emitting units which emit white light, a color filter layer is further formed on the array substrate, and the color filter layer comprises color filter units via which the white light emitted by the light-emitting units is converted into the light of corresponding colors.

In certain embodiments, the plurality of light-emitting units are arranged in matrix formation, the plurality of color filter units are arranged in matrix formation, and the plurality of light-emitting units and the plurality of color filter units are arranged to be respectively and directly aligned.

In certain embodiments, the OLED device comprises a plurality of light-emitting units, and the plurality of light-emitting units comprise at least three kinds of light-emitting units which emit the light of different colors.

In certain embodiments, the plurality of light-emitting units are arranged in matrix formation.

To solve the above problem and others, the present invention further provides a display device comprising the above display panel.

DETAILED DESCRIPTION OF THE INVENTION

Specific embodiments of the present invention are further described in detail below with reference to the drawings and examples. The following embodiments are used for describe the present invention, rather than limiting the scope thereof.

Figure 1:
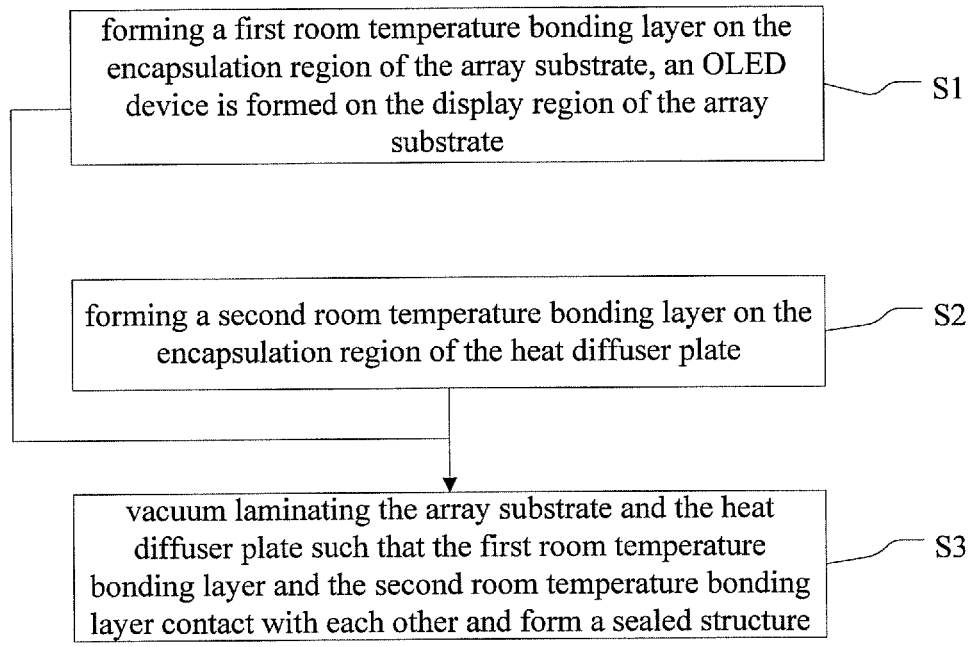
FIG. 1 is a flow chart of an encapsulation method provided by an embodiment of the present invention.

FIG. 1 is a flow chart of an encapsulation method provided by an embodiment of the present invention, comprising:

S1: forming a first room temperature bonding layer on an encapsulation region of an array substrate, wherein an OLED device is formed on a display region of the array substrate;

S2: forming a second room temperature bonding layer on an encapsulation region of a heat diffuser plate; wherein the encapsulation region of the heat diffuser plate is an area directly opposite to the encapsulation region of the array substrate when the heat diffuser plate is directly opposite to the array substrate;

S3: vacuum laminating the array substrate and the heat diffuser plate, such that the first room temperature bonding layer and the second room temperature bonding layer contact with each other and form a sealed structure.

By encapsulating the heat diffuser plate and the array substrate using room temperature bonding technology, the encapsulation method provided by an embodiment of the present invention omits the existing encapsulation substrate, and therefore can not only reduce the overall thickness of the display panel but also further improve the heat dissipation effect.

In the above encapsulation method, the order of the step S1 and the step S2 are not specifically limited. For example, when performing encapsulation, step S1 may be performed firstly followed by step S2; step S2 may also be performed firstly followed by step S1, or step S1 and step S2 may be performed simultaneously. By means of the above mentioned step S1 and step S2, a layer of room temperature bonding layer is formed on the encapsulation region of the array substrate and the encapsulation region of the heat diffuser plate, respectively, and then aligned and laminated both of them in a vacuum environment, thereby forming a sealed structure between the heat diffuser plate and the array substrate.

Figure 2:
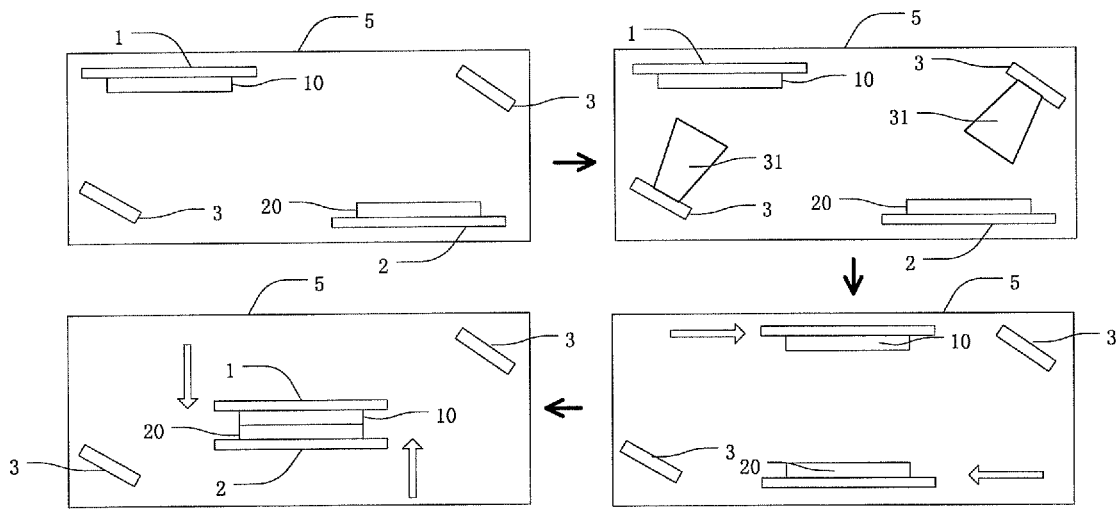
FIG. 2 is a schematic diagram of the encapsulation of a heat diffuser plate and an array substrate as provided by an embodiment of the present invention.

In an embodiment of the present invention, the above heat diffuser plate may be made of a material with relatively good thermal conductivity. For example, the heat diffuser plate can be made of an opaque metal material such as copper, aluminum and so on. The heat diffuser plate may be a monolayer structure formed by one material, and may also be a composite-layer structure formed by multiple materials. The heat diffuser plate and the array substrate are encapsulated by the room temperature bonding technology, thereby obtaining a bottom emission OLED structure. For example, the material of the first room temperature bonding layer may be Si (silicon), Al (aluminum), Cu (copper), Fe (iron) or Au (gold), which is formed on the encapsulation region of the array substrate by ion beam scanning process. The material of the second room temperature bonding layer may be Si, Al, Cu, Fe or Au, which is formed on the encapsulation region of the heat diffuser plate by ion beam scanning process. The heat diffuser plate and the array substrate are encapsulated together by surface atomic bonding (SAB) technology. For example, an Al thin film layer may be formed on the encapsulation region of the heat diffuser plate, and a Si thin film layer may be formed on the encapsulation region of the array substrate. The material of the above mentioned first room temperature bonding layer and the second room temperature bonding layer may also be the same, both of which, for instance, may be Si or Al, etc. Specifically, as shown in FIG. 2, the heat diffuser plate 10 and the array substrate 20 are transported to a vacuum chamber 5 via an upper bearing platform 1 and a lower bearing platform 2, respectively. In the vacuum chamber 5, the ion beam emitting devices 3 emits ion beams to the encapsulation region of the heat diffuser plate 10 and the encapsulation region of the array substrate 20 respectively to form the room temperature bonding layers. Thereafter, the two bearing platforms are moved horizontally such that the heat diffuser plate 10 is aligned to the array substrate 20, and they are then moved in the vertical direction such that the room temperature bonding layer on the heat diffuser plate 10 are tightly bonded to the room temperature bonding layer of the array substrate 20, thereby forming a sealed structure between the heat diffuser plate and the array substrate. Since the entire encapsulation process omits the existing encapsulation substrate, not only the overall thickness of the display panel can be reduced, but the heat dissipation effect can also be improved. Furthermore, transparent thermally conductive materials, such as indium tin oxide (ITO), indium zinc oxide (IZO), and aluminum-doped zinc oxide (AZO), may also be employed by the above heat diffuser plate, and Al, Cu, Ag or Mg is used to form a layer of light-reflecting thin film at the other side of the OLED device, thereby obtaining a top emission OLED structure.

In order to consider both the thickness and the sealing property of the panel formed after encapsulation, the thickness of the heat diffuser plate used by the above encapsulation process may range from 50 μm to 100 μm, which, for instance, may be 60 μm, 80 μm, etc.

Figure 3:
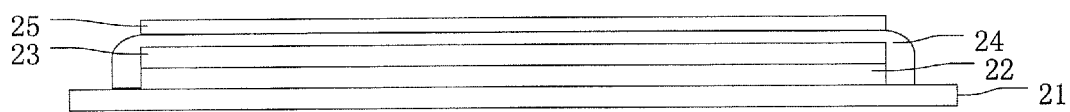
FIG. 3 is a schematic diagram of an array substrate provided by an embodiment of the present invention.

The above array substrate may be a COA (Color Filter on Array) array substrate. As shown in FIG. 3, the array substrate comprises a base substrate 21, and a TFT layer 22, a white light OLED device 23, an encapsulation thin film layer (TFE) 24 and a color filter layer 25, which are formed successively on the base substrate 21. The OLED device 23 comprises a plurality of light-emitting units (not shown) arranged as a matrix, and all of the light emitted by the plurality of light-emitting units is white light. Each light-emitting unit is connected to at least one TFT in the TFT layer 22. The color filter layer 25 comprises a plurality of color filter units arranged as a matrix, and the color filter units in the color filter layer 25 and the light-emitting units in the OLED device are arranged to be respectively and directly aligned. The white light emitted by the light-emitting units is converted by the corresponding color filter units into the light of corresponding colors. For example, the color filter layer 25 may comprise red filter units, green filter units and blue filter units.

Figure 4:
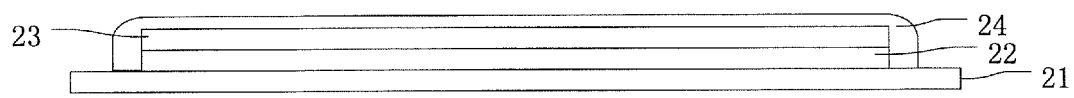
FIG. 4 is a schematic diagram of another array substrate provided by an embodiment of the present invention.

Furthermore, the array substrate in an embodiment of the present invention may also employ a color light OLED device. That is, the light-emitting units per se in the OLED device can emit corresponding color light, thereby omitting the color filter layer. As shown in FIG. 4, the array substrate comprises a base substrate 21, and a TFT layer 22, a color light OLED device 23 and an encapsulation thin film layer 24, which are formed successively on the base substrate 21. The OLED device 23 comprises a plurality of light-emitting units arranged as a matrix. The plurality of light-emitting units comprise at least three kinds of light-emitting units which emitting the light of different colors. For example, the plurality of light-emitting units may comprise light-emitting units for displaying red color, light-emitting units for displaying green color and light-emitting units for displaying blue color.

The encapsulation method provided by embodiments of the present invention attaches the heat diffuser plate directly to the array substrate by using room temperature bonding technology and thereby omits the existing encapsulation substrate, which can not only reduce the overall thickness of the display panel but also further improve the heat dissipation effect. Moreover, the whole encapsulation process no longer needs an encapsulation adhesive or an $N_2$ glove box. As a result, the process is simple and the procedure is effectively shortened.

Figure 5:
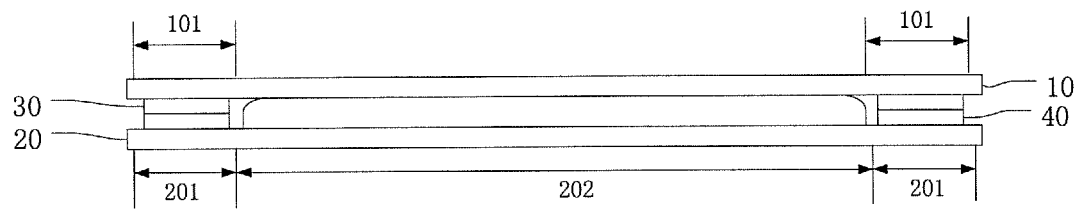
FIG. 5 is a schematic diagram of a display panel provided by an embodiment of the present invention.

Referring to FIG. 5, FIG. 5 is a schematic diagram of a display panel provided by an embodiment of the present invention. The display panel comprises an array substrate 20 and a heat diffuser plate 10 which are oppositely arranged to each other. An OLED device is arranged on a display region 202 of the array substrate 20. A first room temperature bonding layer 40 is arranged on an encapsulation region 201 of the array substrate 20. A second room temperature bonding layer 30 is arranged on an encapsulation region 101 of the heat diffuser plate 10. The first room temperature bonding layer 40 and the second room temperature bonding layer 30 are in contact with each other and are stacked so as to form a sealed structure between the array substrate 20 and the heat diffuser plate 10.

The material of the above heat diffuser plate includes at least one of Cu, Al, ITO, IZO and AZO.

To consider both the thickness and the sealing property of the panel formed after encapsulation, the thickness of the heat diffuser plate ranges from 50 μm to 100 μm.

The material of the above first room temperature bonding layer may be Si, Al, Cu, Fe or Au, and the material of the second room temperature bonding layer may be Si, Al, Cu, Fe or Au.

The above array substrate may be a COA (Color Filter on Array) array substrate. Specifically, the OLED device on the array substrate comprises a plurality of light-emitting units arranged as a matrix, and all of the light emitted by the plurality of light-emitting units is white light. A color filter layer is further formed on the array substrate, wherein the color filter layer comprises color filter units arranged as a matrix. The white light emitted by the light-emitting units is converted into the light of corresponding colors by the color filter units.

Furthermore, the array substrate in an embodiment of the present invention may further employ a color light OLED device. That is, the light-emitting units per se in the OLED device can emit corresponding color light, thereby omitting the color filter layer. Specifically, the OLED device on the array substrate comprises a plurality of light-emitting units arranged as a matrix, and the plurality of light-emitting units comprise at least three kinds of light-emitting units which emitting the light of different colors.

Figure 6:
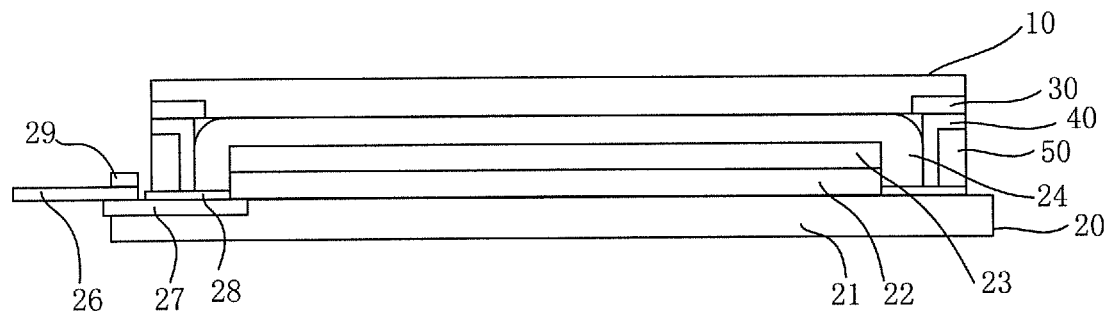
FIG. 6 is a schematic diagram of another display panel provided by an embodiment of the present invention.

Referring to FIG. 6, FIG. 6 is a schematic diagram of a display panel provided by embodiments of the present invention. The display panel comprises an array substrate 20 and a heat diffuser plate 10 which are oppositely arranged to each other. The array substrate 20 comprises a base substrate 21, the display region of which is successively arranged with a TFT layer 22, a color light OLED device 23 and an encapsulation thin film layer 24. The color light OLED device 23 comprises light-emitting units for display red color, light-emitting units for display green color and light-emitting units for displaying blue color (not shown). A peripheral circuit 27 on the array substrate 20 is connected to a flexible printed circuit board (FPC) 26, on which an integrated circuit chip (IC chip) 29 is arranged. An insulating film 28 is arranged on the peripheral circuit 27 and an encapsulation planarization layer 50 is arranged on the insulating film 28. The first room temperature bonding layer 40 formed on the array substrate 20 is elevated by the encapsulation planarization layer 50 so as to tightly attach to the second room temperature bonding layer 30 arranged on the heat diffuser plate 10, thereby forming a sealed structure. For example, the encapsulation planarization layer 50 can be formed simultaneously with the encapsulation thin film layer 24 by a single chemical vapor deposition (CVD) process.

In the example shown in FIG. 6, the display panel comprises a color light OLED device 23. However, as stated above, the OLED device may also be a white light OLED device. In this case, the display panel further needs to provide a color filter layer which comprises corresponding color filter units and thereby converting the white light emitted by the white light-emitting OLED device into the color light of corresponding colors.

The display panel provided by an embodiment of the present invention omits the existing encapsulation substrate since the heat diffuser plate is directly attached to the array substrate by the room temperature bonding technology, which can not only reduce the overall thickness of the display panel but also improve the heat dissipation effect as compared to the existing display panels.

The embodiments of the present invention further provide a display device comprising the above display panel. The display device provided by embodiments of the present invention may be any product or component having display function such as notebook computer display screen, display, television, digital frame, mobile phone, tablet computer, and so on.

The above embodiments are only used for describing the present invention rather than limiting it. Various variations and modifications can further be made by a person having ordinary skill in the art without departing from the spirit and scope of the present invention, thus all equivalent technical solutions also pertain to the scope of the present invention. The patent protection scope of the present invention shall be defined by the claims.

What is claimed is:

1. A display panel, comprising an array substrate and a heat diffuser plate oppositely arranged to each other, an OLED device is arranged on a display region of the array substrate, an encapsulation thin film layer encapsulating the OLED device, a light reflecting film is arranged on a side of the OLED device away from the heat diffuser plate, a first room temperature bonding layer is arranged on an encapsulation region of the array substrate, a second room temperature bonding layer is arranged on an encapsulation region of the heat diffuser plate, wherein the first room temperature bonding layer and the second room temperature bonding layer are in contact with each other and are stacked so as to form a sealed structure between the array substrate and the heat diffuser plate, wherein the heat diffuser plate comprises at least one of ITO, IZO and AZO the array substrate further comprises an encapsulation planarization layer on the encapsulation region, the encapsulation planarization layer comprises a same material as the encapsulation thin film layer, the encapsulation planarization layer comprises a first surface facing the array substrate, a second surface opposite to the first surface and away from the array substrate, and an end face facing the OLED device, and the first room temperature bonding layer directly contacts the end face and at least a portion of the second surface.

2. The display panel according to claim 1, wherein the thickness of the heat diffuser plate ranges from 50 micrometer to 100 micrometer.

3. The display panel according to claim 1, wherein the material of the first room temperature bonding layer is Si, Al, Cu, Fe or Au, and the material of the second room temperature bonding layer is Si, Al, Cu, Fe or Au.

4. The display panel according to claim 1, wherein the OLED device comprises a plurality of light-emitting units which emit white light, a color filter layer is further formed on the array substrate, the color filter layer comprises color filter units, via which the white light emitted by the light-emitting units is converted into the light of corresponding colors.

5. The display panel according to claim 4, wherein the plurality of light-emitting units are arranged in matrix formation, a plurality of the color filter units are arranged in matrix_formation, and the plurality of light-emitting units and the plurality of color filter units are arranged to be respectively and directly aligned.

6. The display panel according to claim 1, wherein the OLED device comprises a plurality of light-emitting units, and the plurality of light-emitting units comprise at least three kinds of light-emitting units which emit the light of different colors.

7. The display panel according to claim 6, wherein the plurality of light-emitting units are arranged in matrix formation.

8. A display device, comprising a display panel, wherein the display panel comprises an array substrate and a heat diffuser plate oppositely arranged to each other, an OLED device is arranged on a display region of the array substrate, an encapsulation thin film layer encapsulating the OLED device, a light reflecting film is arranged on a side of the OLED device away from the heat diffuser plate, a first room temperature bonding layer is arranged on an encapsulation region of the array substrate, a second room temperature bonding layer is arranged on an encapsulation region of the heat diffuser plate, wherein the first room temperature bonding layer and the second room temperature bonding layer are in contact with each other and are stacked so as to form a sealed structure between the array substrate and the heat diffuser plate, wherein the heat diffuser plate comprises at least one of ITO, IZO and AZO the array substrate further comprises an encapsulation planarization layer on the encapsulation region, the encapsulation planarization layer comprises a same material as the encapsulation thin film layer, the encapsulation planarization layer comprises a first surface facing the array substrate, a second surface opposite to the first surface and away from the array substrate, and an end face facing the OLED device, and the first room temperature bonding layer directly contacts the end face and at least a portion of the second surface.

9. An encapsulation method, comprising:
forming an encapsulation thin film layer on a display region of an array substrate, forming an encapsulation planarization layer and a first room temperature bonding layer on an encapsulation region of the array substrate, and forming a second room temperature bonding layer on an encapsulation region of a heat diffuser plate, respectively, wherein an OLED device is formed on a display region of the array substrate, and a light reflecting film is arranged on a side of the OLED device away from the heat diffuser plate the encapsulation thin film layer encapsulates the OLED device, the encapsulation planarization layer comprises a same material as the encapsulation thin film layer, the encapsulation planarization layer comprises a first surface facing the array substrate, a second surface opposite to the first surface and away from the array substrate, and an end face facing the OLED device, and the first room temperature bonding layer directly contacts the end face and at least a portion of the second surface; and
vacuum laminating the array substrate and the heat diffuser plate, such that the first room temperature bonding layer and the second room temperature bonding layer contact with each other and form a sealed structure,
wherein the heat diffuser plate comprises at least one of ITO, IZO and AZO.

10. The encapsulation method according to claim 9, wherein the thickness of the heat diffuser plate ranges from 50 micrometer to 100 micrometer.

11. The encapsulation method according to claim 9, wherein the material of the first room temperature bonding layer is Si, Al, Cu, Fe or Au, and the material of the second room temperature bonding layer is Si, Al, Cu, Fe or Au.

12. The encapsulation method according to claim 9, wherein the OLED device comprises a plurality of light-emitting units which emit white light, a color filter layer is further formed on the array substrate, the color filter layer comprises a plurality of color filter units via which the white light emitted by the light-emitting units is converted into the light of corresponding colors.

13. The encapsulation method according to claim 12, wherein the plurality of light-emitting units are arranged in matrix formation, the plurality of color filter units are arranged in matrix formation, and the plurality of light-emitting units and the plurality of color filter units are arranged to be respectively and directly aligned.

14. The encapsulation method according to claim 9, wherein the OLED device comprises a plurality of light-emitting units, and the plurality of light-emitting units comprise at least three kinds of light-emitting units which emit the light of different colors.

15. The encapsulation method according to claim 14, wherein the plurality of light-emitting units are arranged in matrix formation.

16. The display device according to claim 8, wherein the thickness of the heat diffuser plate ranges from 50 micrometer to 100 micrometer.

17. The display device according to claim 8, wherein the material of the first room temperature bonding layer is Si, Al, Cu, Fe or Au, and the material of the second room temperature bonding layer is Si, Al, Cu, Fe or Au.

18. The display panel according to claim 1, wherein the heat diffuser plate comprises at least one of ITO, IZO and AZO.

19. The display device according to claim 8, wherein the heat diffuser plate comprises at least one of ITO, IZO and AZO.

20. The encapsulation method according to claim 9, wherein the heat diffuser plate comprises at least one of ITO, IZO and AZO.

* * * * *